United States Patent [19]

Neckers

[11] Patent Number: 5,514,519
[45] Date of Patent: *May 7, 1996

[54] PRODUCTION OF THREE-DIMENSIONAL OBJECTS

[75] Inventor: Douglas C. Neckers, Perrysburg, Ohio

[73] Assignee: Spectra Group Limited, Inc., Maumee, Ohio

[*] Notice: The term of this patent shall not extend beyond the expiration date of Pat. No. 5,230,986.

[21] Appl. No.: 224,503

[22] Filed: Apr. 7, 1994

Related U.S. Application Data

[63] Continuation-in-part of Ser. No. 770,123, Oct. 2, 1991, abandoned.

[51] Int. Cl.$^6$ ............................................. G03C 5/00
[52] U.S. Cl. ................ 430/269; 430/138; 430/270.14; 430/281.1; 430/292
[58] Field of Search .......................... 430/269, 292, 430/138, 270, 281; 264/22

[56] References Cited

U.S. PATENT DOCUMENTS

| | | | |
|---|---|---|---|
| 4,842,976 | 6/1989 | Sanders et al. | 430/138 |
| 5,055,372 | 10/1991 | Shanklin et al. | 430/138 |
| 5,088,047 | 2/1992 | Bynum | 264/22 |
| 5,096,530 | 3/1992 | Cohen | 264/22 |
| 5,121,329 | 6/1992 | Crump | 264/22 |
| 5,230,986 | 7/1993 | Neckers | 430/281 |

OTHER PUBLICATIONS

Kosar, translation of Japan Patent Publication 17733, Aug. 4, 1969.

*Primary Examiner*—Mark Chapman
*Attorney, Agent, or Firm*—Thompson Hine & Flory

[57] ABSTRACT

A method for producing a three-dimensional object having selected elements which are colored a different color than the color of other elements of the object, comprising the steps of:

a. providing a film of a photohardenable composition containing a photoresponsive agent, b. irradiating the film in a cross-sectional pattern of the object to be formed so as to form hardened areas in the film, c. selectively irradiating one or more portions of the cross-sectional pattern corresponding to the selected elements which are desired to be colored a different color than the color of other elements of the object with radiation which activates the photoresponsive agent, the photoresponsive agent thereby producing color in or removing color from the selectively irradiated portions of the cross-sectional pattern, the steps being performed with radiation of a different wavelength than the radiation used in performing step b, d. repeating steps a, b and c to form successive adjacent cross-sectional patterns of the object, and e. integrating the cross-sectional patterns to provide the three-dimensional object.

14 Claims, 1 Drawing Sheet

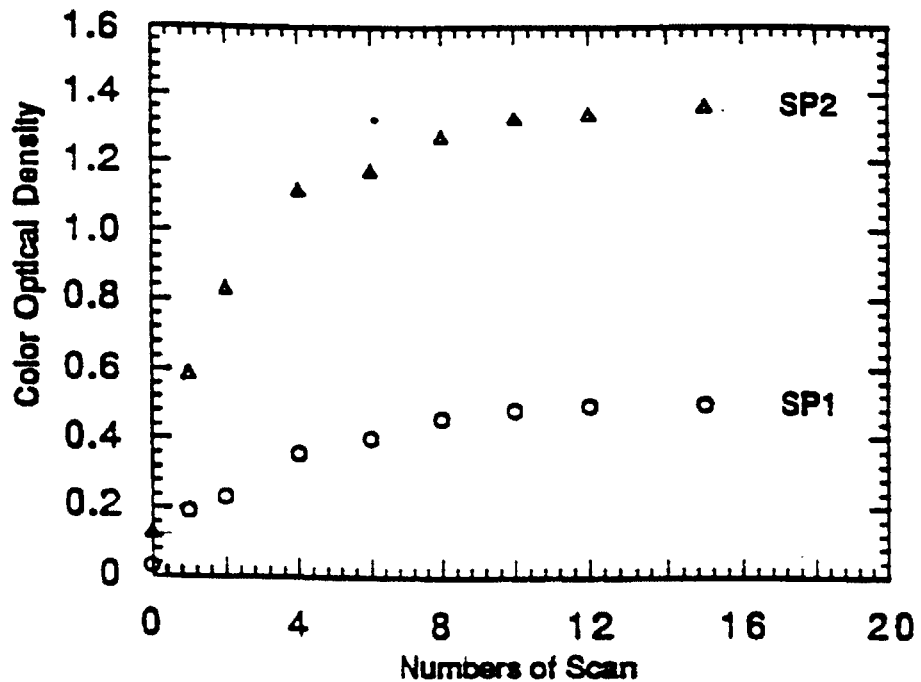
Fig. 1  The relation of color formation with scan numbers for spiropyran compounds
(Irradiated with 325 nm/20mw laser, scan speed 200)
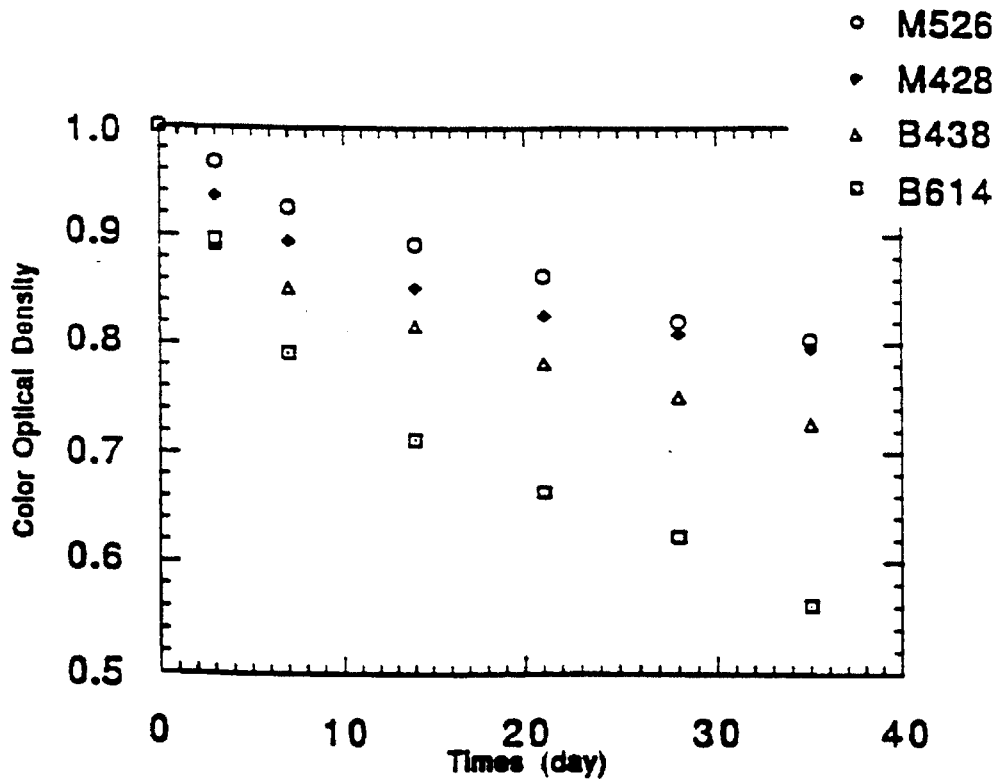
Fig. 2  Color Photostability of Indicators Methyl red and Bromothymol blue
(exposure light intensity about 5mw/cm$^2$)

PRODUCTION OF THREE-DIMENSIONAL OBJECTS

This application is a continuation-in-part of U.S. application Ser. No. 07/770,123, filed Oct. 2, 1991, now abandoned.

FIELD OF THE INVENTION

The invention relates to the preparation of three-dimensional models from tomographic or CAD/CAM data wherein the models include one or more elements of portions which have a distinct color from other elements or portions in the model or which have a distinct texture, resilience or other tactile characteristic from other elements in the model.

BACKGROUND OF THE INVENTION

Several methods and apparatus have been developed for the production of three-dimensional objects or models by irradiation of compositions which crosslink and solidify upon irradiation. U.S. Pat. Nos. 4,041,476 and 4,228,861 to Swainson describe the formation of three-dimensional objects by solidifying each point individually by scanning a volume point by point with intersecting beams of radiation. The Swainson methods are complex and expensive.

U.S. Pat. No. 4,575,330 to Hull describes a method for preparing three-dimensional objects by building up successive thin layers of a solidified photopolymerizable composition. This method has become known as stereolithography. In one embodiment described in the Hull patent, a three-dimensional object is constructed by establishing a thin layer of a photocurable composition on the surface of a platform immersed in a bath of the composition and scanning the layer with a laser beam. The laser controls the X, Y dimension of the model. The Z dimension is controlled by incrementally lowering the platform to greater and greater depths after each successive layer corresponding to a cross-section of the model is polymerized or crosslinked.

Another method for producing three-dimensional objects is described in U.S. Pat. No. 4,940,412 to Blumenthal which discloses a method in which hard copy images having transparent and opaque portions are used as a mask in a photographic process to produce layers which are subsequently stacked and attached to produce a three-dimensional object.

Models prepared previously by the foregoing process methods have been essentially homogeneous in color and texture. It would be desirable to prepare models in which selected elements can be distinctly colored or endowed with a distinct texture, resilience or other tactile characteristic.

SUMMARY OF THE INVENTION

In accordance with the present invention, three-dimensional objects having distinctly colored elements or elements having a distinct tactile characteristic are prepared.

In accordance with the invention, photoresponsive agents are incorporated into the photohardenable composition, and as each lamina of the object is formed, the lamina is scanned with radiation which selectively addresses the photoresponsive agent to cause the agent to bleach, colorize, or alter the tactile characteristic of a portion of the model. Scanning to alter the color or tactile characteristic can be conducted before, during or after the exposure which forms the lamina. In accordance with a preferred aspect of the invention, the three-dimensional objects are prepared by stereolithography using laser initiated photopolymerization.

It is a primary object of the present invention to provide a method for preparing an authentically colored three-dimensional object using actinic radiation.

It is another object of the present invention to provide a method for preparing an object having selected elements which exhibit different tactile characteristics than other elements of the object using actinic radiation.

BRIEF DESCRIPTION OF THE DRAWINGS

FIG. 1 is a graph illustrating color optical density for the spiropyran compounds SP1 and SP2 of Examples 1 and 2 as a function of the number of scans.

FIG. 2 is a graph illustrating decay of optical density as a function of time for methyl red 526 and 428 (Ex. 3) and for bromothymol blue 438 and 614 (Ex. 4).

DEFINITIONS

The term "tactile characteristic" is used herein to mean texture, resilience, elasticity, hardness, etc.

The term "element" is used herein to mean any portion of a model such as a tumor within a model of a brain or a ligament within a model of a knee.

The term "X-Y layer" refers to a single cross-section or lamina of a three-dimensional object which is individually scanned or otherwise irradiated and stacked to form a three-dimensional object.

DETAILED DESCRIPTION OF THE INVENTION

While the invention will be particularly described with respect to its use in conjunction with stereolithography, those skilled in the art will appreciate that the teachings herein can also be used to modify other processes for producing three-dimensional objects such as those described in the aforementioned patent to Blumenthal.

The invention will also be described with reference to processes in which the color-determinative or tactile characteristic determinative irradiation step is conducted after the cross-sectional pattern is exposed. Those skilled in the art will appreciate that the former step may be conducted before, after or simultaneously with the latter step.

In accordance with one embodiment of the invention, a photochromic material is incorporated into the photohardenable composition. The photochromic material may be a photobleachable dye or a colorless dye which is colored by exposure to radiation. After scanning each X-Y layer to harden it, the layer may be scanned using a laser or a focused beam of light or otherwise irradiated to color selected areas of the layer and, hence, selected elements of the three-dimensional object when the X-Y layers are stacked. In stereolithographic processes, the layers are stacked automatically as the platform is lowered in the Z-dimension. In the Blumenthal process, the layers are stacked mechanically. In the case of a photohardenable composition containing a photobleachable dye, the X-Y layer is subsequently exposed in those selected areas in which color is not desired. In the case of a photocolorable agent, those areas of the X-Y layer in which color is desired are subsequently exposed. The photochromic agent cannot respond to the radiation which is used to harden the X-Y layer, otherwise, the agent will be colored or bleached as the layer is hardened. Accordingly, a photochromic material is selected which is sensitive at wavelengths which are distinct from the wavelength of radiation used to harden the X-Y layer. In this manner, by subsequently irradiating those portions of the X-Y layer in which color is desired or not desired, colored elements can be formed in the three dimensional object.

Examples of photochromic dyes useful in the aforementioned embodiment of the invention include merocyanine transformations of the benzospiropyrans described in U.S. patent application Ser. No. 07/649,100 filed Feb. 1, 1991.

Preferred photochromic compounds include 1,3-dihydro-6',8'-dichloro-1-hexyl- 3,3-dimethyl spiro [2H-indole -2,2'-[3H]benzopyran] (SP1) and 1,3-dihydro 6'-nitro-8'-bromo-1-hexyl,3,3-dimethyl spiro[2H-indole-2,2'-[3H]benzopyran] (SP2). The structures of SP1 and SP2 are:

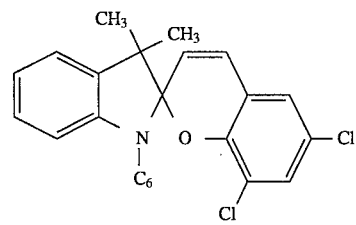

SP1

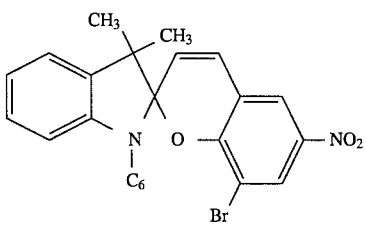

SP2

These spiropyran compounds exhibit excellent photochromic responses and rapid transfer to their color form upon irradiation with distinct wavelength of light. The mechanism for the coloration involves the formation of merocyanine as shown in equation (I):

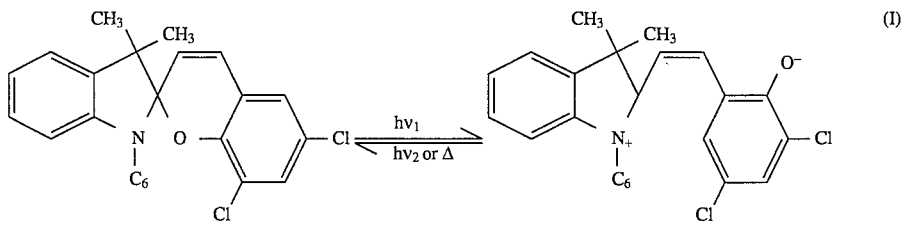

(I)

The extent of color formation or color optical density at the equilibrium is dependent on a number of factors: light intensity, quantum efficiency of the coloration reaction, the extinction coefficient of the merocyanine, and the rate of the reverse reaction. Typically, the composition will contain about 0.01 to 2 parts of photochromic dye per 100 parts monomer.

Examples of photocolorable dyes useful in the aforementioned embodiment are also well known in the art and include the benzospiropyrans described in U.S. patent application Ser. No. 07/649,100 filed Feb. 1, 1991.

In another embodiment of the invention, a combination of photobleachable photoinitiators is used to harden the photohardenable layer. The radiation which is used to harden a preselected portion of the model is selected based upon the color which is desired in that portion of the model. That is, by selecting a radiation which bleaches one of the photoinitiators in the photohardenable composition, the photohardenable composition will be hardened by radicals or other reactive species generated by the bleached photoinitiator while the unbleached photoinitiator colors the layer in the hardened area. In other portions of the model in which another color is desired, the photohardenable layer is hardened by exposure to radiation which bleaches another of the photoinitiators causing it to harden the layer while the remaining photoinitiator(s) color the layer.

In a particular embodiment of the invention, a photocurable X-Y layer containing a monomer, a diazo compound and a photoinitiator is irradiated with visible light to harden it in those areas corresponding to the solid areas of the three-dimensional object. After each X-Y layer is formed, those portions of the X-Y layer in which color is not desired are irradiated with ultraviolet radiation. The X-Y layer is then treated with ammonia vapor analogous to treatments used in blueprinting to selectively color the unirradiated areas.

Diazo compounds useful in this embodiment of the invention are well known in the art and include those compounds used in conventional blue printing. The ammonia gas treatment can be carried out by conducting irradiation in a chamber which can be flooded with ammonia gas following exposure.

In accordance with another embodiment of the invention, microcapsules or microparticles containing color formers or color precursors are prepared. The walls of the microcapsules may be formed from a photodecomposable wall-forming polymer as described in Japanese patent publication 52-34488 (Sep. 3, 1977). Alternatively, photosoftenable microparticles may be formed from photosoftenable compositions as described in U.S. Pat. No. 4,788,125; or the color former may be microencapsulated with a photodecomposable agent that ruptures the microcapsule wall as described in Japanese Publication 44-17733 (Aug. 4, 1969). By incorporating the color former into a photosensitive microcapsule or a photosensitive microparticle as described in the aforementioned references, a color former which would otherwise not be photoresponsive is rendered photoresponsive. By exposing the microcapsule or microparticle to actinic radiation after hardening the X-Y layer, the wall of the capsule or the particle decomposes and the color former is released. As in the case of the photochromic agents, the sensitivity of the microcapsules or microparticles must be distinct from that of the photohardenable composition such that the color precursor can be selectively released independent of the hardening of the X-Y layer.

In a more specific manifestation of the embodiment, the photohardenable composition may contain multiple sets of microcapsules or microparticles which individually contain different color formers. For example, three sets of microcapsules or microparticles respectively containing cyan, magenta and yellow color formers may be used to produce models having elements individually colored any number of different colors or which may be colored an authentic color. For example, microcapsules or microparticles can be prepared which will decompose or soften upon exposure to distinct bands of radiation. After hardening the X-Y layer, the cyan, magenta and yellow microcapsules or microparticles can be selectively exposed to distinct bands of radiation in selected areas of the X-Y layer in order to produce a desired color in a desired portion of the X-Y layer. For example, in those portions of the X-Y layer which are within elements in which a yellow color is desired, the layer would be exposed to radiation which decomposes the yellow color former-containing microcapsules or microparticles. This portion of the X-Y layer would not be exposed to radiation which decomposes the cyan-containing or magenta-containing microcapsules or microparticles. At the same time, in those areas of the X-Y layer corresponding to elements in which red is desired, the layer would be exposed to radiation which decomposes the magenta-containing and yellow-containing microcapsules or microparticles without exposing those areas to radiation which decomposes the cyan-containing microcapsules or microparticles.

Color formers are essentially colorless compounds. Typically they are colored by reaction with an acid or a base. Accordingly, to color the color former released from the microcapsule or microparticle, an acid or basic compound must be incorporated in the photohardenable composition. Alternatively, where the polymer formed is acid or basic, it may function as a developer for the color former.

Useful examples of color formers are well known in the art and can be found in U.S. Pat. No. 4,399,209.

In accordance with yet another embodiment of the invention, the photohardenable composition contains a combination of two or more photobleachable initiators. In accordance with this embodiment, the X-Y layer can be selectively colored by subtracting out color from the layer as the X-Y layer is formed. In this case, the X-Y layer is not uniformly exposed to the same wavelength of radiation in order to harden it. Rather, each portion of the layer is exposed to a wavelength selected based upon the color which is desired in that particular portion of the X-Y layer. In one manifestation of this embodiment of the invention, a combination of cyan, magenta and yellow photobleachable initiators is used. These photoinitiators bleach as they initiate polymerization. In one class of photobleachable initiators, polymerization is initiated by a reductive electron transfer (Chesneau and Neckers, *J. Photochem*, 42, 269 (1988)) which produces the initiating radical intermediate and, in the process, the photoinitiators lose their color.

A subtractive color separation model for the formation of a three-dimensional object in authentic color is thus possible. A monomer mixture containing cyan, magenta and yellow photoinitiator dyes which bleach as they form photopolymer is prepared. Their absorptions must be carefully matched such that they can be individually activated and bleached. Initiation is triggered by radiation tuned to the respective cyan, magenta or yellow absorbing wavelength. Computer input controls the wavelength, power and duration of the irradiation step to thereby control not only the formation of the X-Y layer but also the color of each portion thereof. For example, if initiation is triggered by the yellow absorbing initiator, polymer formation produces a blue object at this point. If the initiation is triggered by a magenta initiator, polymer formation produces a green object at the point. If initiation is triggered by a cyan absorbing dye, the area is orange. Thus, in accordance with the present invention, a three-dimensional authentic color photograph can be prepared using a plurality (typically, three or four) of different bleachable photoinitiators and a like number of actinic radiation sources such as lasers to activate the bleachable photoinitiators.

Examples of initiators useful in this embodiment of the invention include dye borate initiators described in U.S. Pat. No. 4,772,541, fluorones described in European Published Patent Application No. 92304501.7 and the benzospiropyrans described in U.S. Pat. No. 5,230,986 issued Jul. 27, 1993.

In still another embodiment of the invention, selected portions or elements of a model can be colored by selectively entrapping or reacting a dye into the polymer at points where the color is desired. For example, a reactive colored dye monomer such as Rose Bengal acrylate, the acrylate ester of 3-hydroxy Rose Bengal can be copolymerized with the polymerizable monomer during polymerization to selectively deposit the colored monomer in those portions of the X-Y layer where color is desired. That is, by depositing a reactive dye on the X-Y layer in those areas of the X-Y layer in which color is desired and irradiating the layer immediately after deposition of the dye, the dye becomes locked into the X-Y layer in those areas in which it is deposited. Alternatively, non-reactive dyes can be deposited on the layer in an analogous fashion prior to hardening the X-Y layer. Subsequent polymerization of the X-Y layer entraps the dye producing the desired coloration. The use of non-reactive dyes may be compatible with the formation of three-dimensional objects using the Blumenthal process, however, problems of bleeding or spreading may be encountered with stereolithographic processes wherein the X-Y layer is subsequently immersed in the photohardenable composition as the platform is lowered in the Z direction.

Examples of other reactive dyes which can be used in accordance with this embodiment of the invention include any dye which is modified to include a vinyl group. Examples of non-reactive dyes are readily available in the art.

From the standpoint of producing selective coloration, the composition of the photohardenable composition is not particularly critical. Examples of monomers, oligomers, and photoinitiators useful in photohardenable compositions are described in European publication No. 0 393 672 to DuPont and U.S. Pat. No. 4,575,330, to Hull.

In yet another manifestation of the invention, an indicator and a photosensitive acid generator or photosensitive base generator is incorporated into the photohardenable composition and upon irradiation, an acid or base is generated which produces a change in pH which causes the indicator dye to undergo a change in color. For example, 2-nitrobenzaldehyde is a photoacid generator. It is converted to 2-nitrobenzoic acid upon irradiation with UV light. Generally, the yield of photoacid is proportional to the exposure time and light intensity. Preferably, the photosensitive composition contains a hydrophilic polymer since the polymers generally contain a small amount of water which is indispensable for proton transfer from the acid to the indicator dye. One advantage in using this method is that the formed color generally has a fairly high photostability. It is believed that this stability is due to continued formation of acid (or base) under normal room light. Any conventional indicator dye can be used in the invention including leuco dyes used in carbonless paper and conventional acid base indicators.

In accordance with a further embodiment of the invention, tactile characteristics of selected portions of the three-dimensional model are modified. In accordance with this embodiment of the invention, the degree of crosslinking is increased in selected areas of the X-Y layer to produce a tactile difference. One of the principal applications for the present invention is in the preparation of three-dimensional anatomical models. It would be desirable in preparing these models to alter the tactile characteristics of certain portions of the model so as to mimic the different touch, texture or resilience of various anatomical features. For example, in preparing a model of the knee, it would be desirable to form the bone of a highly crosslinked essentially inelastic polymer and to form the ligaments from a more elastic polymer.

One technique for imparting different tactile characteristics to the model is to irradiate the X-Y layer to produce a first level of crosslinking in the polymer forming the layer. Subsequently, additional crosslinking can be introduced into selected portions of the layer by additional exposure. Alternatively, differences in the degree of crosslinking which result in different tactile characteristics may be produced by modulating the intensity of the laser beam as the X-Y layer is scanned.

One possible chemistry for use in achieving tactile differences through adjusting degree of crosslinking is based on oxime acrylates and is described in detail in Kumar, G. S., and Neckers, D. C., "Laser-induced Three Dimensional Photopolymerization Using Visible Initiators and UV Cross-Linking by Photosensitive Monomers" *Macromolecules Vol.* 24, No. 15,p 4322 (1991). Oxime acrylates have absorption maxima in the UV range. The paper describes a study of photopolymerization of oxime acrylates with visible initiators using an argon ion laser and photocrosslinking of pendant groups using He-Cd UV laser or a high pressure mercury vapor lamp. Thus, the X-Y layer in this embodiment may be polymerized by scanning with a visible light laser and a second scan with a UV laser can be used to modify the degree of crosslinking and to produce a tactile difference.

EXAMPLE 1

Twenty one milligrams ($1\times10^{-3}$M) 1,3-dihydro-6',8'-dichloro-1-hexyl-3,3-dimethyl spiro[2H-indole-2,2'-[3H] benzopyran (SP1) was dissolved in 5 g ethanol/polyethylene glycol 400 diacitate (PEAG) (1:1) and mixed with a standard photocurable composition (4.9 mg ($2\times 10^{-4}$M) 5,7-diiodo-3-ethoxy-6-fluorone (DIEF), 205 mg ($2\times 10^{-2}$M) N,N-dimethyl-2,6-diisopropylaniline, 20 g trimethylolpropane triacrylate, 20 g dipentaerythritol penta-acrylate, and 5 g polyethylene glycol 400 diacetate) for 30 minutes in a Supersonic mixer. The mixture was then scanned with 514 nm argon laser in a stereolithography apparatus (SLA) to form a polymeric layer. A 325 nm He-Cd laser was used to activate the SP1 dye and produce a yellow color ($\lambda$ max=606 nm) in the polymeric layer. A two-color polymeric model was formed by scanning the composition with 514 nm and 325 nm lasers, respectively, in the stereolithography apparatus. To intensify the coloration, the image was scanned 15 times. A model was found having blue components and yellow components.

EXAMPLE 2

Twenty three milligrams ($1\times10^{-3}$M) 1,3-dihydro-6 -nitro-8'-bromo-1-hexyl-3,3-dimethyl spiro[2H-indole-2,2' -[-3H] benzopyran] (SP2) was dissolved in 5 g ethanol/PEGA and mixed with the standard photocurable composition as in Example 1. After scanning the mixture to form a polymeric layer, a 325 nm He-Cd laser was used to activate the SP2 dye and form a magenta color ($\lambda$ max=558) in the polymeric layer. A model having pink and white colored components was formed.

The color optical density of SP1 and SP2 (Examples 1 and 2, respectively) were observed at their maximum absorption wavelength 606 and 558, respectively, and the data shown in Table 1 is the optical density of formed color before (scan time equal zero) and after scanning with 325 nm laser up to 15 times.

As illustrated in FIG. 1, the color optical density for the spiropyran compounds increased dramatically after each scan during the first 10 scans and appeared to level off until reaching equilibrium at about 15 scans.

TABLE 1

| Relation of color formation with exposure for spiropyran compounds | | | | | | | | | |
|---|---|---|---|---|---|---|---|---|---|
| Scan Times | 0 | 1 | 2 | 4 | 6 | 8 | 10 | 12 | 15 |
| sp1-1 | .0306 | .1916 | .2329 | .3582 | .4009 | .4559 | .4810 | .4948 | .4991 |
| sp2-1 | .1306 | .5898 | .8337 | 1.118 | 1.175 | 1.273 | 1.328 | 1.341 | 1.363 |

EXAMPLE 3

Seven hundred milligrams polyvinyl alcohol (molecular weight~86,000) was dissolved in 20 ml (1:1) boiling water-ethanol solution. 15.2 mg 2-nitrobenzaldehyde (5 mM) and 5.4 mg methyl red indicator (1 mM) were added to the hot solution with stirring until a homogenous solution was formed. An aqueous solution of sodium hydroxide was added to adjust the pH of the solution until the methyl red indicator was in its basic form as indicated by the formation of a light yellow color.

The cooled solution was coated onto a glass slide and dried over night to form a homogenous film having a slightly yellow color. Upon irradiation with 325 nm laser, the film changed color from light yellow to deep red indicating that the irradiation caused the basic methyl red indicator ($\lambda$ max =428) to change to its acidic form having an absorption peak $\lambda$ max of 526 nm.

EXAMPLE 4

The procedure of Example 3 was repeated using bromothymol blue indicator in place of methyl red. Upon irradiation with 325 nm laser, the blue colored film formed from the basic solution changed to a yellow colored film indicating that the irradiation caused the basic bromothymol blue indicator ($\lambda$ max=614 nm) to change to its acidic form having an absorption peak $\lambda$ max of 438.

The results of Example 3 and 4 are illustrated in FIG. 2.

Having described the invention in detail and with reference to particular embodiments thereof, those skilled in the art will appreciate that numerous modifications and variations are possible without departing from the spirit and scope of the invention as defined by the appended claims.

What is claimed is:

1. A method for producing a three-dimensional object having selected elements which are colored a different color than the color of other elements of said object, comprising the steps of:

a. providing a film of a photohardenable composition containing a photoresponsive agent, b. irradiating said film in a cross-sectional pattern of the object to be formed so as to form hardened areas in said film.

c. selectively irradiating one or more portions of said cross-sectional pattern corresponding to said selected elements which are desired to be colored said different color than the color of other elements of the object with radiation which activates said photoresponsive agent, said photoresponsive agent thereby producing color in or removing color from said selectively irradiated portions of said cross-sectional pattern, said steps being performed with radiation of a different wavelength than the radiation used in performing step b, d. repeating said steps a, b and c to form successive adjacent cross-sectional patterns of said object, and e. integrating said cross-sectional patterns to provide said object.

2. The method of claim 1 wherein said three-dimensional object is prepared by stereolithography.

3. The method of claim 1 wherein said irradiation is accomplished using at least one laser.

4. The method of claim 1 wherein said photoresponsive agent is a photochromic compound.

5. The method of claim 4 wherein said photochromic compound is a benzospiropyran.

6. The method of claim 5 wherein said photochromic compound is 1,3-dihydro-6',8'-dichloro-1-hexyl-3,3-dimethyl spiro[2H-indole-2,2'-[3H]benzopyran].

7. The method of claim 5 wherein said photochromic compound is 1,3-dihydro-6'-nitro-8'-bromo-1-hexyl,3,3-dimethyl spiro[2H-indole-2,2'-[3H]benzopyran].

8. The method of claim 1 wherein said photoresponsive agent comprises a photosensitive acid generator or photosensitive base generator.

9. The method of claim 8 wherein said photoresponsive agent is methyl red or bromothymol blue and 2-nitrobenzaldehyde.

10. The method of claim 1 wherein said photoresponsive agent is a photobleachable dye.

11. The method of claim 1 wherein said photohardenable composition contains a plurality of photoresponsive agents, each agent controlling the formation of a different color such that selected portions of said objects may be colored differently.

12. The method of claim 1 wherein said step c is performed after said step b.

13. The method of claim 1 wherein said step c is performed simultaneously with step b.

14. The method of claim 13 wherein said photoresponsive agent is a photobleachable photoinitiator.

* * * * *